United States Patent [19]

Granneman et al.

[11] Patent Number: 5,354,433
[45] Date of Patent: Oct. 11, 1994

[54] METHOD FOR PRODUCING A FLOW OF TRIISOBUTYLALUMINUM FROM LIQUID TRIISOBUTYLALUMINUM CONTANING ISOBUTENE

[75] Inventors: Ernst H. A. Granneman, Hilversum; Laurens F. T. Kwakman, Zeist; Hans W. Piekaar, Utrecht; Boudewijn G. Sluijk, Bilthoven, all of Netherlands

[73] Assignee: ASM International N.V., Bilthoven, Netherlands

[21] Appl. No.: 768,319

[22] PCT Filed: Apr. 30, 1990

[86] PCT No.: PCT/NL90/00042
§ 371 Date: Nov. 19, 1991
§ 102(e) Date: Nov. 19, 1991

[87] PCT Pub. No.: WO90/12900
PCT Pub. Date: Nov. 1, 1990

[30] Foreign Application Priority Data

Apr. 9, 1989 [NL] Netherlands ............ 8900980

[51] Int. Cl.⁵ ................................ B01D 3/00
[52] U.S. Cl. ......................... 203/71; 159/47.1; 159/DIG. 10; 203/99; 556/187; 556/190
[58] Field of Search ............ 203/88, 71, 99, 1, 91; 118/724, 726; 202/176; 159/DIG. 10, 28.6, 47.1, 2.1; 556/187, 190

[56] References Cited

U.S. PATENT DOCUMENTS

| | | | |
|---|---|---|---|
| 2,847,320 | 8/1958 | Bulloff | 427/252 |
| 4,923,717 | 5/1990 | Gladfelter et al. | 427/252 |
| 4,924,936 | 5/1990 | McKown | 159/13.2 |
| 5,144,053 | 9/1992 | Allen et al. | 585/671 |

FOREIGN PATENT DOCUMENTS

| | | | |
|---|---|---|---|
| 0653017 | 11/1962 | Canada | 427/252 |
| 3076874 | 4/1988 | Japan | 427/252 |
| 0868845 | 5/1961 | United Kingdom | 427/252 |

Primary Examiner—Virginia Manoharan
Attorney, Agent, or Firm—Young & Thompson

[57] ABSTRACT

Method for providing a proportioned gas flow of triisobutylaluminum from liquid triisobutylaluminum having isobutene admixed therein. The liquid is preheated sufficiently to evaporate the isobutene therefrom but leaving the triisobutylaluminum substantially in liquid phase. The vaporized isobutene is separated from the liquid triisobutylaluminum, and subsequently the triisobutylaluminum from which isobutene has been removed is evaporated. Preheating is conducted at a temperature of 30°–40° C. The evaporation of liquid triisobutylaluminum is conducted at a temperature of 40°–60° C.

2 Claims, 1 Drawing Sheet

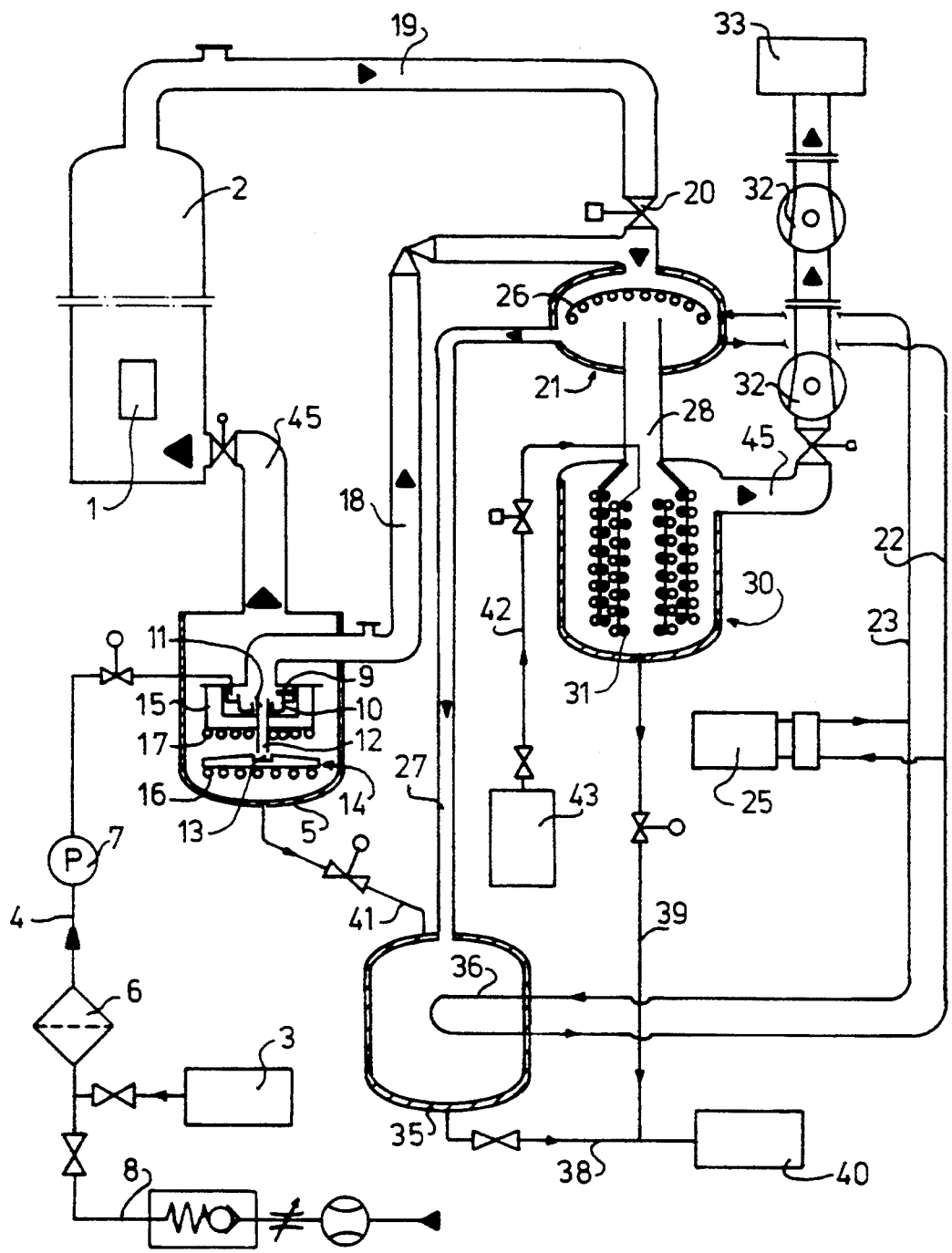

METHOD FOR PRODUCING A FLOW OF TRIISOBUTYLALUMINUM FROM LIQUID TRIISOBUTYLALUMINUM CONTANING ISOBUTENE

The invention relates to a method for producing a flow of triisobutylaluminum from liquid triisobutylaluminum containing isobutene.

Such a method is known from U.S. Pat. No. 2,847,320. TIBA (triisobutylaluminum) is used for depositing an aluminum layer on a substrate by chemical means. For this purpose, the TIBA should be present in a gaseous state. TIBA is delivered as a liquid product and consequently has to be evaporated. In this process, isobutene inter alinea is released as an undesirable byproduct. In the method and apparatus according to U.S. Pat. No. 2,847,320, it is necessary to use relatively high grade TIBA to keep the quantity of isobutylene as low as possible. Using TIBA having laboratory grade means that the costs for depositing an aluminum layer will increase.

The invention aims to overcome this drawback and to provide a method making it possible to use industrial grade TIBA.

The introduction of a preheating step of the TIBA before supplying to the evaporator and removing the isobutene released, results in a TIBA product of higher quality which can be used to deposit aluminum on a substrate. Because of the preheating step industrial grade TIBA can be used.

Preferably, the preheating is carried out at 30°-40° C. and the evaporation at 40°-60° C.

According to a further advantageous embodiment, the proportioned vapor flow containing essentially TIBA is fed to a reactor and the discharge therefrom is combined with the vapor containing isobutene described above. By combining the two vapor flows, it is possible to provide a single removal system. Such a removal system is of importance, because, if the reactor employs reduced pressure, the outlet for used TIBA may take place via the pump connection. It is undesirable that TIBA reaches said pump because the pump may be damaged thereby. In order to avoid this, the TIBA (or isobutene respectively) has to be removed before reaching the pump. This can be done by cooling the exhaust gases. This may be carried out in at least two steps. In this case, essentially all the TIBA is removed in the first step and essentially the isobutene in the second, colder step.

BRIEF DESCRIPTION OF THE DRAWING

The sole figure is a schematic block diagram of the process of the invention.

DESCRIPTION OF THE PREFERRED EMBODIMENT

Here a substrate schematically indicated by 1 has to be treated in a reactor generally indicated by 2 in a manner such that an aluminum layer is deposited thereon. The reactor 2 may be a reactor such as is described, for example, in NL-A-8,900,544. For this purpose, the apparatus according to the invention comprises a source 3 of TIBA connected via a pipe 4 to a vessel 5. The pipe 4 incorporates a filter 6 and a proportioning pump 7. Connected to pipe 4 is a flushing pipe 8 for, for example, $N_2$. After being passed through the wall of vessel 5, pipe 4 opens into chamber 9. The said chamber 9 has a terraced bottom 10 in the center of which an overflow 11 is fitted whose end 12 opens into a cavity 13 in the center of a plate evaporator indicated as a whole by 14. Both the plate evaporator 14 and container 15 in which chamber 9 is provided are provided with heating means 16 and 17, respectively. A thermally insulating material may possibly be provided between container 15 and plate evaporator 14. Container 15 is provided with an outlet pipe 18 which is connected to outlet pipe 19 of vessel 2. An adjustable shut-off valve 20 is fitted in outlet pipe 19. Outlet pipe 19 opens, on the other hand, into cooling vessel 21. This vessel is supplied via pipes 22, 23 with a coolant from cooling apparatus 25. A cooling plate 26 is fitted in cooling vessel 21 and an outlet 27 is embodied near the bottom. An outlet 28 projecting to some extent above the bottom of the vessel is connected to freezing vessel 30. Fitted in the latter are cooling plates 31 which are cooled with liquid nitrogen supplied from source 43 via pipe 42. Connected to freezing vessel 30 is an outlet 45 which is connected to pump system 32 which opens into removal system 33. Outlet pipe 27 is connected to vessel 35 which contains a cooling coil 36 which is also connected to cooling apparatus 25. Vessel 35 is provided with an outlet 38 at the bottom which converges with outlet 39 from the bottom of freezing vessel 30 and opens into the removal system 40 for used product. Vessel 5 is provided, in addition, with an outlet 41 which opens at the top of vessel 35.

The apparatus described above operates as follows:

After the system has been flushed with nitrogen originating from the flushing pipe 8 in order to expel the oxygen present from the system, the source 3 of TIBA is connected and TIBA is transported via pump 7 into vessel 5. The TIBA entering chamber 9 of holder 5 moves according to a predetermined movement pattern via bottom 10 to overflow 11 with a fixed retention time. The TIBA contained in chamber 9 is heated by heating system 17 in a manner such that, on the one hand, the TIBA remains liquid but essentially all the isobutene present evaporates. This preheating is preferably carried out between 30° and 40° C. Then the liquid TIBA is introduced into cavity 13 and from there is spread directly over the plate evaporator 14, which is kept at a temperature of 40° to 60° by heating. As a result of this, the TIBA evaporates and travels towards reactor 2 via a pipe 45. In reactor 2, the substrate 1 undergoes the desired treatment after possibly preheating the TIBA further. Used TIBA and isobutene are removed by, respectively, outlet pipe 19, 18 in the manner described below. This manner of evaporating TIBA has the advantage that the quantity of TIBA to be evaporated is determined exclusively by the quantity of TIBA supplied. The rate of evaporation is not controlled, as in the prior art, by controlling the temperature of heating system 16, 17, but by controlling the output of pump 7.

Because both the TIBA removed and the isobutene are detrimental to the functioning of pump system 32, means have to be provided to remove said vapor before they reach said vacuum pump system 32. For this purpose, cooling vessel 21 and freezing vessel 30 are present. In cooling vessel 21, the material entering it from pipe 18 and 19 is cooled in a manner such that essentially all the TIBA is liquefied in vessel 21. That is to say, it was found in a test that approximately 80% of the material is liquefied therein. Said liquid product is removed via outlet 27 to vessel 35, where it is kept cooled.

At set times, if vessel 35 is getting full, the TIBA can be removed via pipe 38 to system 40. The gaseous product still present enters, via outlet 28, freezing vessel 30 and freezes at cooling plates 31. Because said cooling plates are appreciably cooled by means of liquid nitrogen originating from source 43 via pipe 42, product detrimental to pump system 32 will virtually no longer be present in the outlet 45. Because most of the material is removed in cooling vessel 21, freezing vessel 30 can be of comparatively limited capacity, but it must be understood that material adhering to the cooling plates 31 remains there until the end of a processing cycle. When the freezing vessel 30 is unfrozen, liquid product is produced near the bottom and is passed via pipe 39 to removal system 40.

Although the invention has been described above with reference to a preferred embodiment, it must be understood that many changes which are obvious to those skilled in the prior art can be made thereto without departing from the scope of the invention of the type for which protection is claimed hereinafter. For example, instead of the pump 7, any other metering means known in the prior art can be used, such as a shut-off valve.

We claim:

1. Method for producing a gas flow consisting essentially of triisobutylaluminum from liquid triisobutylaluminum having isobutene admixed therein, comprising preheating said liquid triisobutylaluminum to a first temperature of 30°–40° C. to evaporate said isobutene therefrom but leave said triisobutylaluminum substantially in liquid phase, separating said vaporized isobutene from said liquid triisobutylaluminum at said temperature of 30°–40° C., subsequently vaporizing at a second temperature of 40°–60° C. said triisobutylaluminum from which isobutene has been removed, said second temperature being substantially higher than said first temperature whereby an industrial grade triisobutylaluminum is obtained.

2. A method as claimed in claim 1, and feeding said vaporized triisobutylaluminum to a reactor and discharging used triisobutylaluminum to a reactor and discharging used triisobutylaluminum from said reactor, and combining said discharged triisobutylaluminum with said evaporated isobutene into a stream, and cooling and liquefying said stream.

* * * * *